(12) United States Patent
Kameda et al.

(10) Patent No.: US 10,978,293 B2
(45) Date of Patent: Apr. 13, 2021

(54) OXIDE FILM FORMATION METHOD

(71) Applicant: MEIDENSHA CORPORATION, Tokyo (JP)

(72) Inventors: Naoto Kameda, Moriya (JP); Toshinori Miura, Chiba (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 17/041,047

(22) PCT Filed: Nov. 28, 2018

(86) PCT No.: PCT/JP2018/043658
§ 371 (c)(1),
(2) Date: Sep. 24, 2020

(87) PCT Pub. No.: WO2019/187337
PCT Pub. Date: Oct. 3, 2019

(65) Prior Publication Data
US 2021/0028011 A1  Jan. 28, 2021

(30) Foreign Application Priority Data
Mar. 28, 2018 (JP) .............................. JP2018-060983

(51) Int. Cl.
*H01L 21/02* (2006.01)
*C23C 16/40* (2006.01)
*C23C 16/455* (2006.01)

(52) U.S. Cl.
CPC ...... *H01L 21/02271* (2013.01); *C23C 16/402* (2013.01); *C23C 16/455* (2013.01); *H01L 21/02164* (2013.01)

(58) Field of Classification Search
None
See application file for complete search history.

(56) References Cited

U.S. PATENT DOCUMENTS

2010/0018460 A1* 1/2010 Singh ..................... C30B 29/06
118/620
2010/0025852 A1* 2/2010 Ueki ................. H01L 21/02167
257/761
(Continued)

FOREIGN PATENT DOCUMENTS

JP 07-078809 A 3/1995
JP 11-322979 A 11/1999
(Continued)

OTHER PUBLICATIONS

Japanese Office Action and English translation, Application No. 2018-567977, dated Mar. 12, 2019, 6 pages.
(Continued)

*Primary Examiner* — Asok K Sarkar
(74) *Attorney, Agent, or Firm* — Foley & Lardner LLP (57) ABSTRACT

Disclosed is an oxide film formation method that includes supplying an ozone gas having an ozone concentration of 20 to 100 vol %, an unsaturated hydrocarbon gas and a raw material gas to a workpiece (7) placed in a pressure-reduced treatment furnace (5), whereby an oxide film is formed on a surface of the workpiece (7) by a chemical vapor deposition process. An example of the unsaturated hydrocarbon gas is an ethylene gas. An example of the raw material gas is a TEOS gas. The flow rate of the ozone gas is preferably set equal to or more than twice the total flow rate of the unsaturated hydrocarbon gas and the raw material gas. By this oxide film formation method, the oxide film is formed on the workpiece (7) at a high deposition rate even under low-temperature conditions of 200° C. or lower.

22 Claims, 6 Drawing Sheets

(56) References Cited

U.S. PATENT DOCUMENTS

| | | |
|---|---|---|
| 2010/0300482 A1 | 12/2010 | Miura |
| 2018/0044492 A1 | 2/2018 | Miura et al. |
| 2018/0079764 A1 | 3/2018 | Harada et al. |
| 2020/0354386 A1* | 11/2020 | Ridgeway ............ C23C 16/401 |

FOREIGN PATENT DOCUMENTS

| | | |
|---|---|---|
| JP | 2001-304756 A | 10/2001 |
| JP | 2003-20209 A | 1/2003 |
| JP | 2007-109984 A | 4/2007 |
| JP | 2008-294170 A | 12/2008 |
| JP | 2009-141028 A | 6/2009 |
| JP | 2013-207005 A | 10/2013 |
| JP | 2016-210742 A | 12/2016 |
| JP | 2017-22294 A | 1/2017 |
| JP | 2017-121721 A | 7/2017 |
| JP | 6569831 B1 | 9/2019 |
| KR | 10-1777689 B1 | 9/2017 |
| WO | WO 2016/143897 A1 | 9/2016 |

OTHER PUBLICATIONS

Written Opinion and Written Amendment and English translations to Japanese Office Action, Application No. 2018-567977, dated May 10, 2019, 10 pages.

Decision to Grant a Patent and English translation, Japanese Application No. 2018-567977, dated Jul. 9, 2019, 5 pages.

Korean Office Action and English translation, Application No. 10-2020-7025101, dated Jan. 8, 2021, 15 pages.

Office Action and English translation issued in Chinese Patent Application No. 201880091593.3 dated Jan. 13, 2021, fourteen (14) pages.

* cited by examiner

OXIDE FILM FORMATION METHOD

FIELD OF THE INVENTION

The present invention relates to an oxide film formation method. More particularly, the present invention relates to an oxide film formation method by which an oxide film can be formed on a substrate or film of synthesis resin.

BACKGROUND ART

As to organic materials for use in packaging applications, electronic components, flexible devices and the like, it is common to form inorganic films on the organic materials for the purpose of surface protection and functionality addition. Further, studies are made on the flexibilization of various electronic devices where it is required to e.g. form the electronic devices on organic films.

As film forming technologies, chemical vapor deposition (CVD) and physical vapor deposition (PVD) are known. These film forming technologies have been used for the formation of various insulating films, conductive films etc. in the manufacturing processes of fine electronic devices such as semiconductor device, sensor and FPD (flat panel display). In general, the chemical vapor deposition is superior in terms of the film deposition rate and covering property.

In a chemical vapor deposition process, a film is formed on a workpiece by reacting a raw material gas including a film constituent element-containing compound (such as, for example, silane (that is a generic name for hydrogen silicate), TEOS (tetraethyl orthosillicate), TMA (trimethyl aluminum), tungsten fluoride ($WF_6$) etc.) with the addition of a reactive gas and depositing the resulting reaction product on the workpiece. This chemical vapor deposition process is performed under high-temperature conditions of several hundreds ° C. or higher in order to promote the reaction between the gases and to improve the quality of the film on the workpiece. In other words, the chemical vapor disposition process is difficult to perform under low-temperature conditions. The temperature of the chemical vapor deposition process often exceeds the heat resistant temperatures of organic materials.

As an example of the application of a high-concentration ozone gas to the chemical vapor deposition, there is known a technique of forming a $SiO_2$ film on a substrate by the use of a high-concentration ozone gas and a TEOS gas under high-temperature conditions of several hundreds ° C. or higher (see e.g. Patent Document 1).

In order to form a film with good quality by a chemical vapor deposition process under low-temperature conditions, it is necessary to introduce a reactive species which has a high chemical reactivity even under low-temperature conditions. For example, there are known: a technique in which a coating film deposited on a workpiece is oxidized at a temperature of 100° C. or lower (see e.g. Patent Document 2); and a technique in which an ashing reaction for removal of organic substances is conducted at room temperature (see e.g. Patent Documents 3 and 4). Each of these techniques realizes the process at a temperature of 200° C. or lower by the action of a reactive species generated from the reaction of high-concentration ozone with unsaturated hydrocarbon.

In the conventional chemical vapor deposition techniques, however, the reaction rate is low at temperatures of 200° C. or lower, and the thus-formed oxide film is not only low in quality but also low in deposition rate. Hence, the conventional chemical vapor deposition techniques face the problem that it is impossible to form good oxide films on workpieces at temperatures of 200° C. or lower and thereby difficult to produce devices with good characteristics.

PRIOR ART DOCUMENTS

Patent Documents

Patent Document 1: Japanese Laid-Open Patent Publication No. 2007-109984
Patent Document 2: Japanese Laid-Open Patent Publication No. 2013-207005
Patent Document 3: Japanese Laid-Open Patent Publication No. 2008-294170
Patent Document 4: Japanese Laid-Open Patent Publication No. 2009-141028

SUMMARY OF THE INVENTION

The present invention has been made in view of the above circumstances. It is accordingly an object of the present invention to provide an oxide film formation method capable of forming an oxide film on a workpiece at a temperature of 200° C. or lower.

In accordance with one aspect of the present invention to achieve the above object, there is provided an oxide film formation method comprising supplying, to a workpiece on which an oxide film is to be formed, an ozone gas, an unsaturated hydrocarbon gas and a raw material gas containing a Si element or metal element which is a constituent element of the oxide film, whereby the oxide film is formed on a surface of the workpiece by a chemical vapor deposition process.

In accordance with another aspect of the present invention to achieve the above object, there is provided an oxide film formation method as described above,
wherein the workpiece is a substrate or film made of a synthesis resin, and
wherein, after the ozone gas and the unsaturated hydrocarbon gas are supplied to the workpiece, the oxide film is formed on the surface of the workpiece by supplying the ozone gas, the unsaturated hydrocarbon gas and the raw material gas to the workpiece.

In accordance with another aspect of the present invention to achieve the above object, there is provided an oxide film formation method as described above,
wherein, after the oxide film is formed on the surface of the workpiece by supplying the ozone gas, the unsaturated hydrocarbon gas and the raw material gas to the workpiece, the ozone gas and the unsaturated hydrocarbon gas are supplied to the workpiece.

In accordance with another aspect of the present invention to achieve the above object, there is provided an oxide film formation method as described above, wherein the unsaturated hydrocarbon gas is an ethylene gas.

In accordance with another aspect of the present invention to achieve the above object, there is provided an oxide film formation method as described above, wherein, during the formation of the oxide film on the workpiece, a supply flow rate of the ozone gas is equal to or more than twice a total supply flow rate of the unsaturated hydrocarbon gas and the raw material gas.

In accordance with another aspect of the present invention to achieve the above object, there is provided an oxide film formation method as described above,
wherein, during the formation of the oxide film on the workpiece, at least one of supply flow rates of the ozone gas, the unsaturated hydrocarbon gas, the raw material gas and an inert gas for stirring the gases fed to the workpiece is periodically changed.

In accordance with another aspect of the present invention to achieve the above object, there is provided an oxide film formation method as described above, wherein the supply flow rate of the ozone gas and the supply flow rate of the unsaturated hydrocarbon gas are maintained constant, and the supply flow rate of the raw material gas is periodically changed.

In accordance with another aspect of the present invention to achieve the above object, there is provided an oxide film formation method as described above, wherein a shower head is disposed at a position away from the workpiece and opposed to the surface of the workpiece, and wherein the supplying includes mixing the unsaturated hydrocarbon gas and the raw material gas to prepare a mixed gas in advance, and then, supplying the mixed gas and the ozone gas to the workpiece from different supply holes of the shower head.

In accordance with another aspect of the present invention to achieve the above object, there is provided an oxide film formation method as described above, wherein a shower head is disposed at a position away from the workpiece and opposed to the surface of the workpiece, and wherein the supplying includes mixing the ozone gas and the raw material gas to prepare a mixed gas in advance, and then, supplying the mixed gas and the unsaturated hydrocarbon gas to the workpiece from different supply holes of the shower head.

In accordance with another aspect of the present invention to achieve the above object, there is provided an oxide film formation method as described above, wherein, during the formation of the oxide film on the workpiece, a supply flow rate of the ozone gas is 0.2 sccm or higher.

The above-described aspects of the present invention leads to the formation of an oxide film on a workpiece at a temperature of 200° C. or lower.

BRIEF DESCRIPTION OF DRAWINGS

FIG. 6($a$) is a characteristic diagram showing a relationship between deposition rate and deposition temperature of $SiO_2$ in the case where the TEOS gas is supplied from the lateral side of the substrate; and FIG. 6($b$) is a characteristic diagram showing a relationship between deposition rate and deposition temperature of $SiO_2$ in the case where the TEOS gas is supplied from above the treatment surface of the substrate.

DESCRIPTION OF EMBODIMENTS

An oxide film formation method according to one embodiment of the present invention will be described in detail below with reference to the drawings.

The oxide film formation method according to the embodiment of the present invention includes supplying, into a treatment furnace where a workpiece on which an oxide film is to be formed is placed, an ozone gas, a raw material gas containing a constituent element of the oxide film and an unsaturated hydrocarbon gas whereby the oxide film is formed on the workpiece by a chemical vapor deposition (CVD) process.

The workpiece is a substrate, a film or the like. Since the oxide film formation method according to the embodiment of the present invention allows the formation of the oxide film under low-temperature conditions, not only a relatively high heat-resistant substrate such as Si substrate but also a substrate or film made of a relatively low heat-resistant synthetic resin are usable as the workpiece. Examples of the synthetic resin usable as the material of the substrate or film are polyester resin, aramid resin, olefin resin, polypropylene, PPS (polyphenylene sulfide), PET (polyethylene terephthalate) and the like. As other examples of the synthetic resin, there can also be used PE (polyethylene), POM (polyoxymethylene or acetal resin), PEEK (poly ether ether ketone), ABS resin (acrylonitrile-butadiene-styrene copolymerized synthetic resin), PA (polyamide), PFA (tetrafluoroethylene-perfluoroalkoxyethylene copolymer), PI (polyimide), PVD (polyvinyldichloride) and the like.

It is preferable that the ozone gas has as high as an ozone concentration. For example, the ozone concentration (in volume %) of the ozone gas is preferably 20 to 100 vol %, more preferably 80 to 100 vol %. The reason for this is that, as the ozone concentration of the ozone gas is closer to 100 vol %, a reactive species (OH) generated from the ozone reaches a surface of the workpiece at a higher density. The reactive species (OH) participates in the reaction required for chemical vapor deposition. In addition, the reactive species (OH) reacts with carbon (C) contained as an impurity in the film so that the impurity carbon (C) can be removed in gaseous form. Accordingly, the oxide film is formed with less impurity by supplying a larger amount of the reactive species (OH) to the surface of the workpiece. In view of the tendency that the higher the ozone concentration of the ozone gas (i.e. the lower the oxygen concentration of the ozone gas), the longer the lifetime of atomic oxygen (O) generated by dissociation of the ozone, it is preferable to use the ozone gas of high concentration. More specifically, the atomic oxygen (O) can be prevented from being deactivated upon collision with the oxygen molecule when the oxygen concentration decreases with increase of the ozone concentration. Further, the process pressure during the oxide film formation process can be reduced with increase of the ozone concentration. It is thus preferable to use the high-concentration ozone gas in terms of the gas flow control and gas flow improvement.

The flow rate of the ozone gas is preferably, for example, 0.2 sccm or higher, more preferably 0.2 to 1000 sccm. The unit "sccm" expresses sec ($cm^3$/min) at 1 atm (1013 hPa) and 25° C. Furthermore, the flow rate (supply amount) of the ozone gas is preferably set equal to or more than twice the flow rate (supply amount) of the unsaturated hydrocarbon gas. The reason for this is that, since the decomposition of the unsaturated hydrocarbon gas to OH group proceeds in a plurality of steps, a sufficient amount of OH group may not be obtained due to shortage of the ozone molecule required for the reaction in the case where the ozone gas and the unsaturated hydrocarbon gas are supplied at a ratio of ozone molecule:unsaturated hydrocarbon molecule=1:1. In the case where the unsaturated hydrocarbon gas and the raw material gas are supplied simultaneously, the flow rate of the ozone gas is preferably set equal to or more than twice the total flow rate of the unsaturated hydrocarbon gas and the raw material gas so that the oxide film can be formed at a good deposition rate.

The high-concentration ozone gas can be obtained by liquefying and separating ozone from an ozone-containing gas on the basis of a difference in vapor pressure, and then, gasifying the liquefied ozone. As a device for generating the high-concentration ozone gas, there can be used any of ozone gas generators disclosed in patent documents such as Japanese Laid-Open Patent Publication No. 2001-304756 and Japanese Laid-Open Patent Publication No. 2003-20209. These high-concentration ozone gas generators are each configured to generate a high-concentration ozone gas (ozone concentration 100 vol %) by isolating ozone through liquefaction separation based on a difference in vapor pressure between ozone and another gas (e.g. oxygen). In particular, the ozone gas generator, when equipped with a plurality of chambers for liquefying and gasifying only ozone, enables continuous supply of the high-concentration ozone gas by individual temperature control of the chambers. One commercially available example of the high-concentration ozone gas generator is Pure Ozone Generator (MPOG-HM1A1) manufactured by Meidensha Corporation.

The raw material gas used is a gas containing as a constituent thereof any element(s) which constitutes the oxide film (such as lithium (Li), magnesium (Mg), silicon (Si), titanium (Ti), vanadium (V), chromium (Cr), manganese (Mn), iron (Fe), cobalt (Co), nickel (Ni), copper (Cu), zinc (Zn), gallium (Ga), germanium (Ge), yttrium (Y), zirconium (Zr), molybdenum (Mo), ruthenium (Ru), rhodium (Rh), indium (In), tin (Sn), tungsten (W), iridium (Ir), platinum (Pt), lead (Pd) and the like; hereinafter also generically referred to as "metal" or "metal element"). For example, there can be used a raw material gas containing an organic silicon compound having a Si—O bond or Si—C bond or an organic metal compound having a metal-oxygen bond or metal-carbon bond, or a raw material gas composed of a metal halide, an organic metal complex, a hydride of silicon or metal etc. Specific examples of the raw material gas are gases of TEOS (tetraethyl orthosillicate), TMS (trimethoxysilane), TES (triethoxysilane), TMA (trimethylalminium), TEMAZ (tetrakis(ethylmethylamino)zirconium), tungsten fluoride ($WF_6$) and the like. As the raw material gas, there can also be used a gas of heterogeneous polynuclear complex containing a plurality of kinds of metal elements (as disclosed in e.g. Japanese Laid-Open Patent Publication No. 2016-210742) rather than containing one kind of metal element. The flow rate of the raw material gas is preferably, for example, 0.1 sccm or higher, more preferably 0.1 to 500 sccm.

The unsaturated hydrocarbon gas used is a gas of double bond-containing hydrocarbon (also called alkene) such as ethylene or triple bond-containing hydrocarbon (also called alkyne) such as acetylene. In addition to ethylene and acetylene, a gas of low-molecular-weight unsaturated hydrocarbon (e.g. a unsaturated hydrocarbon having a carbon number n of 4 or less) such as butlene is also suitably usable as the unsaturated hydrocarbon gas. The flow rate of the unsaturated hydrocarbon gas is preferably, for example, 0.1 sccm or higher, more preferably 0.1 to 500 sccm.

Figure 1:
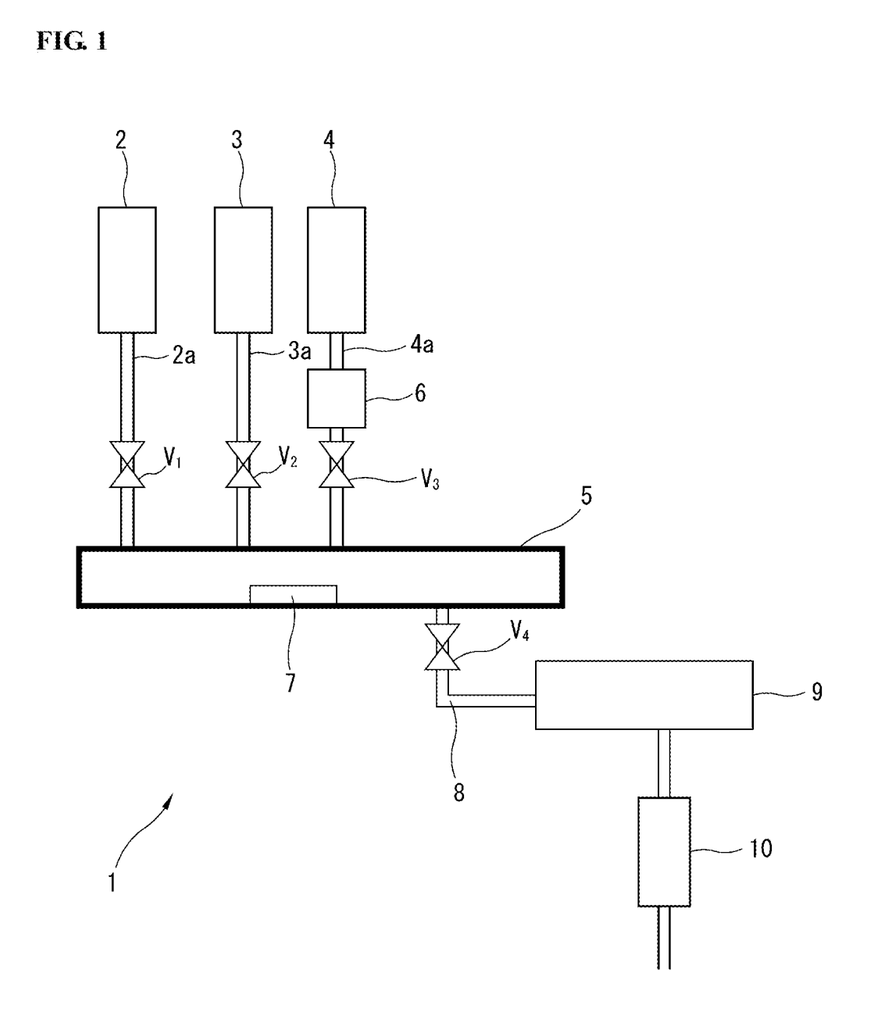
FIG. 1 is a schematic view of an oxide film formation treatment system according to a first embodiment of the present invention.

FIG. 1 is a schematic view of an oxide film formation treatment system 1 according to the first embodiment of the present invention. This embodiment specifically refers to the case where the oxide film is formed using an ozone gas having an ozone concentration of 100 vol %, an ethylene gas as an unsaturated hydrocarbon gas and a TEOS gas as a raw material gas. The oxide film can be formed in the same manner as in this embodiment even in the case where other gases are used as the unsaturated hydrocarbon gas and the raw material gas.

The oxide film formation treatment system 1 has an ozone gas generator 2 (or a cylinder filled with high-concentration ozone gas), an ethylene gas cylinder 3, a TEOS gas cylinder 4 and a treatment furnace 5 (chamber) in which the process treatment takes place.

The ozone gas generator 2 is arranged to supply the ozone gas into the treatment furnace 5. The ozone gas generator 2 is connected to the treatment furnace 5 via a pipe 2a. A variable flow rate valve $V_1$ is mounted to the pipe 2a so as to individually control the flow rate of the ozone gas. The flow rate in the pipe 2a is measured based on e.g. a difference between primary and secondary pressures of the valve $V_1$ and a cross-sectional area of the pipe 2a. In this way, the flow rate measurement of the ozone gas is preferably carried out using a device of the type that measures the flow rate based on a pressure difference. This is because the use of a heating-type measurement device leads to decomposition of the ozone.

The ethylene gas cylinder 3 is arranged to supply the ethylene gas into the treatment furnace 5. The ethylene gas cylinder 3 is connected to the treatment furnace 5 via a pipe 3a. A variable flow rate valve $V_2$ is mounted to the pipe 3a so as to individually control the flow rate of the ethylene gas. Although not specifically shown in the drawing, the pipe 3a is equipped with a measurement device such as mass flow meter for measuring the flow rate of the ethylene gas.

The TEOS gas cylinder 4 is arranged to supply the TEOS gas into the treatment furnace 5. The TEOS gas cylinder 4 is connected to the treatment furnace 5 via a pipe 4a. A variable flow rate valve $V_3$ is mounted to the pipe 4a so as to individually control the flow rate of the TEOS gas. The flow rate of the TEOS gas is measured based on e.g. a difference between primary and secondary pressures of the valve $V_3$ and a cross-sectional area of the pipe 4a. Further, the pipe 4a is equipped with a gasification chamber 6. In the gasification chamber 6, the TEOS is heated to e.g. 70° C. or higher. The TEOS, which is liquid at ordinary temperatures, is gasified in the gasification chamber 6 and then supplied into the treatment furnace 5. It is preferable to feed an inert gas such as nitrogen gas as a carrier gas in the pipe 4a in order to improve the flow of the TEOS gas.

The treatment furnace 5 may be equipped with a pipe for supplying an inert gas (e.g. nitrogen gas) to stir or purge the gases inside the treatment furnace 5 although not specifically shown in the drawing.

In the treatment furnace 5, the workpiece 7 on which the oxide film is to be formed is placed. The oxide film (in this embodiment, $SiO_2$ film) is formed on the workpiece 7 by chemical vapor deposition in the treatment furnace 5. The treatment furnace 5 is preferably a cold-wall-type furnace so as to suppress decomposition of the ozone etc. at a wall surface of the treatment furnace 5. A gas discharge pipe 8 is connected to the treatment furnace 5. The gas discharge pipe 8 is equipped with a vacuum pump 9 and a depollution unit 10 for decomposition of the residual gases after the gas discharge so that the gases inside the treatment furnace 5 are discharged into the air through the depollution unit 10. A variable flow rate valve V is mounted to the discharge pipe 8 so as to control the pressure inside the treatment furnace 5 during the film formation process.

Figure 2:
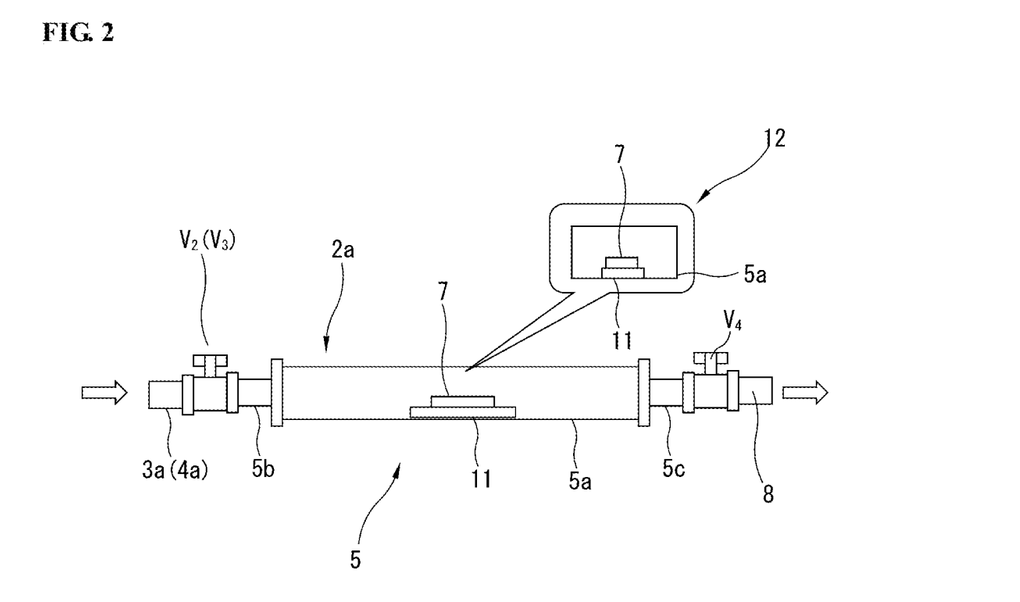
FIG. 2 is a detail view of a treatment furnace of the oxide film formation treatment system.

FIG. 2 is a detail view of the treatment furnace 5. The treatment furnace 5 has a furnace body 5a in which the workpiece 7 is placed. The furnace body Sa is provided with a work stage 11 (heating susceptor) so that the workpiece 7a is located on the work stage 11. As a heater (not shown) for heating the work stage 11, for example, an infrared light source used as heating mean in the semiconductor manufacturing technology can be applied. The workpiece 7 is heated to a predetermined temperature by heating the work stage 11.

A pipe 5b, to which the pipes 3a and 4a for introduction of the ethylene gas and the TEOS gas are connected, is provided on one end of the furnace body 5a so that a mixed gas of the ethylene gas and the TEOS gas is supplied into the furnace body 5a through the pipe Sb. A pipe Sc, to which the discharge pipe 8 is connected, is provided on the other end of the furnace body 5a so that the respective gases introduced into the furnace body 5a pass by the surface of the workpiece 7a and then flow out through the discharge pipe 8. Although not specifically shown in FIG. 2, the pipe 2a for introduction of the ozone gas is connected to the furnace body 5a at a location adjacent to the pipe Sb such that the ozone gas can be supplied in a direction parallel to the treatment surface of the workpiece 7a.

In other words, the pipes 2a to 4a are connected to the furnace body 5a so that the ozone has, the ethylene gas and the TEOS gas are supplied in a horizontal direction to the treatment surface of the workpiece 7. The furnace body Sa, the pipes 2a to 4a, the pipes 5b and Sc and the discharge pipe 8 can be of any materials (such as aluminum, quartz glass etc.) which withstand stress deformation even under vacuum and do not undergo deterioration by oxidation with the ozone.

Further, a cross section of a work stage 1I-equipped part of the furnace body 5a is shown in FIG. 2. The smaller the cross-sectional area of the work stage 11-equipped part of the furnace body Sa through which the gas flows, the higher the flow rate of the gas in the vicinity of the surface of the workpiece 7. For example, when a spacer (not shown) is disposed at a position away from and opposed to the surface of the workpiece 7, the width of the flow path through which the gas flows over the surface of the workpiece 7 is narrowed so that the flow rate of the gas is increased. With such increase in the flow rate of the gas over the surface of the workpiece 7, the gas in an unreacted state can also be supplied to a downstream part of the workpiece 7. This allows the deposition of the film on the downstream part of the workpiece 7.

Figure 3:
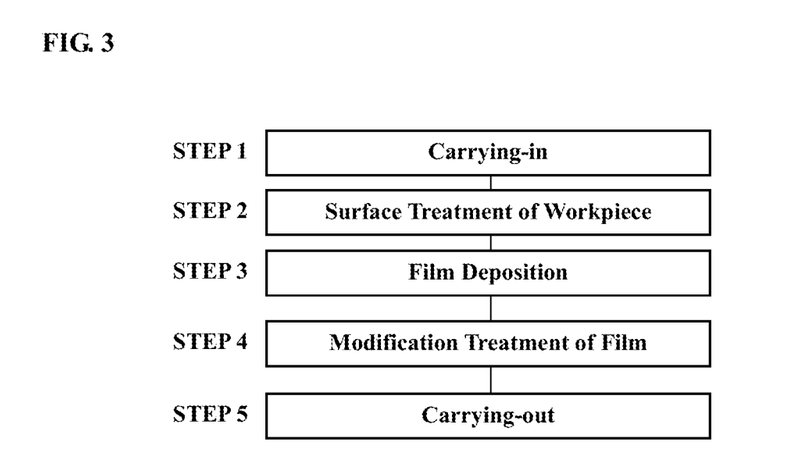
FIG. 3 is a flowchart for an oxide film formation treatment performed by the oxide film formation treatment system.

Next, the oxide film formation method executed by the oxide film formation treatment system 1 will be explained below referring to a flowchart of FIG. 3.

(Step 1: Carrying-In of Workpiece)

A nitrogen gas is fed into the treatment furnace 5 so that the gas residing in the treatment furnace 5 is removed and replaced (purged) with the nitrogen gas. Next, the workpiece 7 is placed in the treatment furnace 5. The valve $V_4$ is opened, and then, the pressure inside the treatment furnace 5 is reduced to 1 Pa or lower by means of the vacuum pump 9. While the valve $V_4$ is kept in an open state, the work stage 11 is heated such that the temperature of the workpiece 7 reaches a predetermined temperature.

(Step 2: Pretreatment)

The valves $V_1$ and $V_2$ are opened to supply the ozone gas and the ethylene gas. With this operation, the oxidation active species (OH) is introduced to and adsorbed onto the surface of the workpiece 7. As a result, the surface of the workpiece 7 is made hydrophilic so as to improve the adhesion of the later-formed $SiO_2$ film to the surface of the workpiece 7. The flow rate of the ozone gas is set within the range of e.g. 0.2 to 1000 sccm; and the flow rate of the ethylene gas is set within the range of e.g. 0.1 to 500 sccm. Further, the process pressure is controlled to e.g. 1000 Pa or lower in order to prevent explosion of the ozone gas. In this way, the supply of the ozone gas and the ethylene gas is continued until the next step. It is preferable that the flow rate of the ozone gas is equal to or more than twice the flow rate of the ethylene gas.

(Step 3: Main Treatment)

The valve $V_3$ is opened to supply the TEOS gas. The flow rate of the TEOS gas is set within the range of e.g. 0.1 to 500 sccm. It is preferable that the flow rate of the ozone gas is equal to or more than twice the total flow rate of the ethylene gas and the TEOS gas. The process pressure is controlled to e.g. 1000 Pa or lower.

In this treatment step, it is feasible to fix the flow rates of the ozone gas, the ethylene gas (unsaturated hydrocarbon gas) and the TEOS gas (raw material gas) at constant rates during the process, or feasible to change one or more of the flow rates of the ozone gas, the ethylene gas (unsaturated hydrocarbon gas) and the TEOS gas (raw material gas) with time or periodically. The gas flow rate can be changed with time or periodically by decreasing the gas flow rate or by stopping the gas supply for a predetermined time period. In conjunction with such gas flow change operation, an inert gas may be supplied periodically to stir or purge the gases inside the treatment furnace 5 and thereby uniformalize the gas distribution inside the treatment furnace 5. The oxide film is formed more uniformly on the workpiece 7 by supplying the inert gas into the treatment furnace 5 and/or individually changing the flow rate of the gas such as raw material gas. The following three process patterns are conceivable as specific examples of the secular change of the gas flow rate during the process.

<Pattern 1>

During the process, the flow rate of the ozone gas, the flow rate of the ethylene gas and the flow rate of the TEOS gas are maintained constant.

In the treatment of pattern 1, the thickness of the oxide film formed on the workpiece 7 increases at a constant rate during the treatment period.

<Pattern 2>

During the process, the flow rate of the ozone gas and the flow rate of the ethylene gas are maintained constant; whereas the flow rate of the TEOS gas is periodically changed.

The treatment of pattern 2 is to supply the TEOS gas into the treatment furnace 5 filled with the ozone gas and the ethylene gas. The oxide film of high quality is formed more uniformly by supplying the TEOS gas into the space filled with the ozone gas and the ethylene gas.

In the case where the flow rate of the ozone gas is maintained constant, for example, the amount of the ozone decreases toward the downstream side of the treatment furnace 5 due to the reaction of the ozone gas with the ethylene gas and the TEOS gas. Further, the amount of the active species (OH) that reacts with the TEOS decreases toward the downstream side with the flow of the TEOS gas in the treatment furnace 5.

As mentioned above, there arises a deviation in the distribution of the ozone and the active species within the treatment furnace 5 during the formation of the oxide film on the workpiece 7. Hence, the treatment furnace 5 is filled with the ozone gas and the ethylene gas by decreasing (or stopping) the supply amount of the TEOS gas and thereby removing any unnecessary product generated by the reaction in the treatment furnace 5. The TEOS gas is then supplied into the treatment furnace 5 filled with the ozone gas and the ethylene gas. With this treatment operation, the thickness and quality of the oxide film on the workpiece 7 are made more uniform.

In the treatment of pattern 2, the formation of the oxide film on the workpiece 7 and the modification of the oxide film formed on the workpiece 7 with the mixed gas of the ozone gas and the ethylene gas (including the reactive species) are repeated by periodically changing the flow rate of the TEOS gas during the process. As a consequence, the oxide film of higher quality is uniformly formed.

<Pattern 3>

During the process, the flow rate of the ozone gas and the flow rate of the TEOS gas are maintained constant; whereas the flow rate of the ethylene gas is periodically changed.

It is considered that the reaction between the ozone and the TEOS hardly proceeds at temperatures of 200° C. or lower as compared to the case where the ethylene exists in the system. Thus, the formation of the oxide film on the workpiece 7 and the filling of the treatment furnace with the ozone gas and the TEOS gas are repeated by periodically changing the flow rate of the ethylene gas during the process. With this treatment operation, the oxide film of higher quality is formed uniformly.

In addition to the above-exemplified patterns, it is conceivable to obtain the same effects by maintaining the flow rates of the ethylene gas and the TEOS gas constant while periodically changing the flow rate of the ozone gas during the process. In other words, the deposition rate of the oxide film is changed with time or periodically by changing at least one of the flow rates of the ozone gas, the unsaturated hydrocarbon gas, the raw material gas and the inert gas with time or periodically. By changing at least one of the flow rates of these gases with time or periodically, it is possible to suppress thickness unevenness and quality deterioration of the oxide film caused due to the deviation in the distribution of the ozone and the active species within the treatment furnace 5 during the formation of the oxide film on the workpiece 7. It is further possible by changing the gas flow distribution in the treatment furnace 5 to change the distribution of film thickness increase in the in-plane direction of the workpiece 7 by the deposition of the oxide film and thereby control the distribution of the oxide film in the in-plane direction of the workpiece 7. Even any of the patterns is adopted, the oxide film formation treatment is performed until the oxide film reaches a predetermined thickness. Then, the process shifts to the next step.

It is herein assumed that, in this embodiment, the oxide film is formed by performing the treatment operation according to process pattern 2. When the flow rate of the TEOS gas is temporarily set very low as in process pattern 2, the amount of OH supplied to the oxide film on the workpiece 7 is increased so that the modification effect of the oxide film can be expected in the subsequent step as will be explained in detail below.

(Step 4: Post-Treatment)

The valve $V_3$ is closed to stop the supply of the TEOS gas. The deposition of the oxide film is stopped by stopping the supply of the TEOS gas. On the other hand, OH is supplied to the surface of the oxide film formed on the workpiece 7 as in the case of STEP 2. The supplied OH diffuses through the film and chemically reacts with the impurity such as carbon (C) or hydrogen (H) in the film. Consequently, the impurity in the film is converted into gas form (CO, $CO_2$ or $H_2O$) and removed from the film. The flow rate of the ozone gas, the flow rate of the ethylene gas and the pressure range inside the treatment furnace 5 in STEP 4 are the same as those in STEP 2. Since the modification time of the oxide film formed on the workpiece 7 increases with increase in the thickness of the oxide film, the modification time is set as appropriate depending on the thickness of the oxide film formed on the workpiece 7.

(Step 5: Carrying-Out of Workpiece)

The valves $V_1$ and $V_2$ are closed to stop all of the gas supplies. The pressure inside the treatment furnace 5 is set to 1 Pa or lower. The valve $V_4$ is closed to stop the gas discharge. Then, the inside of the treatment furnace 5 is filled with an inert gas such as nitrogen gas such that the pressure inside the treatment furnace is set to atmospheric pressure. In this state, the workpiece 7 is taken out of the treatment furnace 5. With this, the series of process steps are completed.

Figure 4:
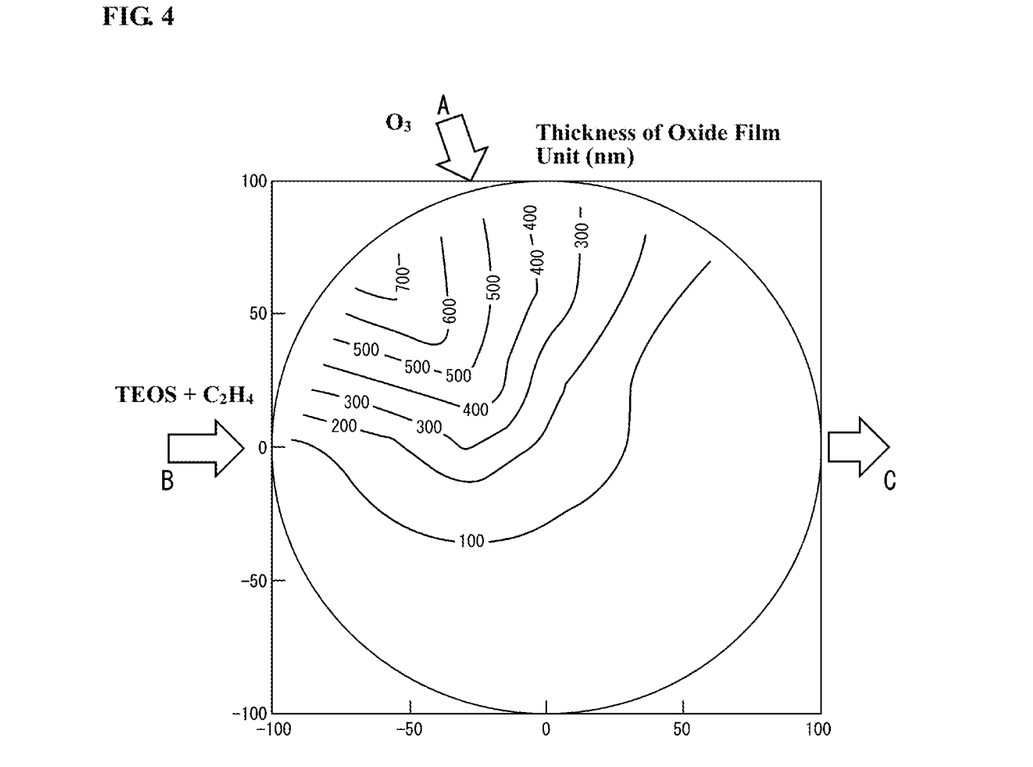
FIG. 4 is a diagram showing a result of the oxide film formation treatment performed on a substrate by supplying a TEOS gas from a lateral side of the substrate.

FIG. 4 is a diagram showing a result of the formation of the oxide film (more specifically, a thickness distribution (in units of nm) of the $SiO_2$ film) on the workpiece 7 (8-inch Si wafer) through the execution of the chemical vapor deposition process at room temperature (25° C.) by the oxide film formation system 1 according to this embodiment of the present invention. In the figure, an arrow A represents the position of supply of the ozone gas; an arrow B represents the position of supply of the ethylene gas and the TEOS gas; and an arrow C represents the position of connection of the discharge pipe 8.

The result shown in FIG. 4 was obtained by performing the film formation treatment for 10 minutes under the gas flow conditions that: the flow rate of the ozone gas was 200 sccm: the flow rate of the ethylene gas was 25 sccm: and the flow rate of the TEOS gas was 25 sccm at a process pressure of the treatment furnace 5 of about 40 Pa.

As shown in FIG. 4, the thickness of the oxide film became maximum in the vicinity of the ozone gas supply position and became small at around the gas discharge position. It is apparent from this result that it is possible to control the thickness distribution of the oxide film by regulating the gas flow (or moving the workpiece 7). Furthermore, the maximum value of the thickness of the oxide film was 780 nm: and the maximum value of the film deposition rate was 78 nm/min.

Figure 5:
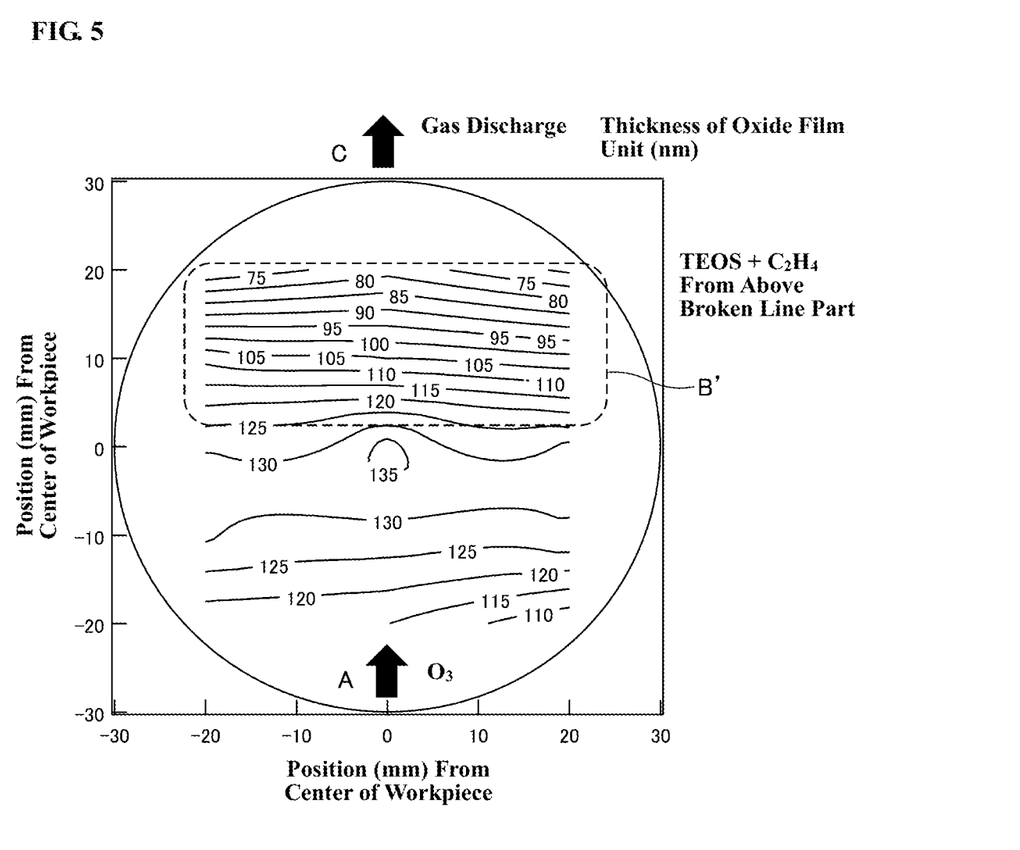
FIG. 5 is a diagram showing a result of the oxide film formation treatment performed on a substrate by supplying a TEOS gas is supplied from above a treatment surface of the substrate.

FIG. 5 is a diagram showing a result of the formation of the oxide film (more specifically, a thickness distribution (in units of nm) of the $SiO_2$ film) on the workpiece 7 (8-inch Si wafer) through the execution of the chemical vapor deposition process at room temperature (25° C.) with the supply of the ethylene gas and the TEOS gas from above the workpiece 7. In the figure, an arrow A represents the position of supply of the ozone gas; a part B' encircled by a broken line represents the position of supply of the ethylene gas and the TEOS gas. The ethylene gas and the TEOS gas were supplied to the treatment surface of the workpiece 7 from above the treatment surface of the workpiece 7. Further, an arrow C represents the position of connection of the discharge pipe 8.

The result shown in FIG. 5 was obtained by performing the film formation treatment for 3 minutes under the gas flow conditions that: the flow rate of the ozone gas was 100 sccm; the flow rate of the ethylene gas was 64 sccm; and the flow rate of the TEOS gas was 0.3 sccm at a process pressure of the treatment furnace 5 of about 50 Pa. The maximum value of the thickness of the oxide film was 138 nm. The maximum value of the film deposition rate was 46 nm/min.

Figure 6:
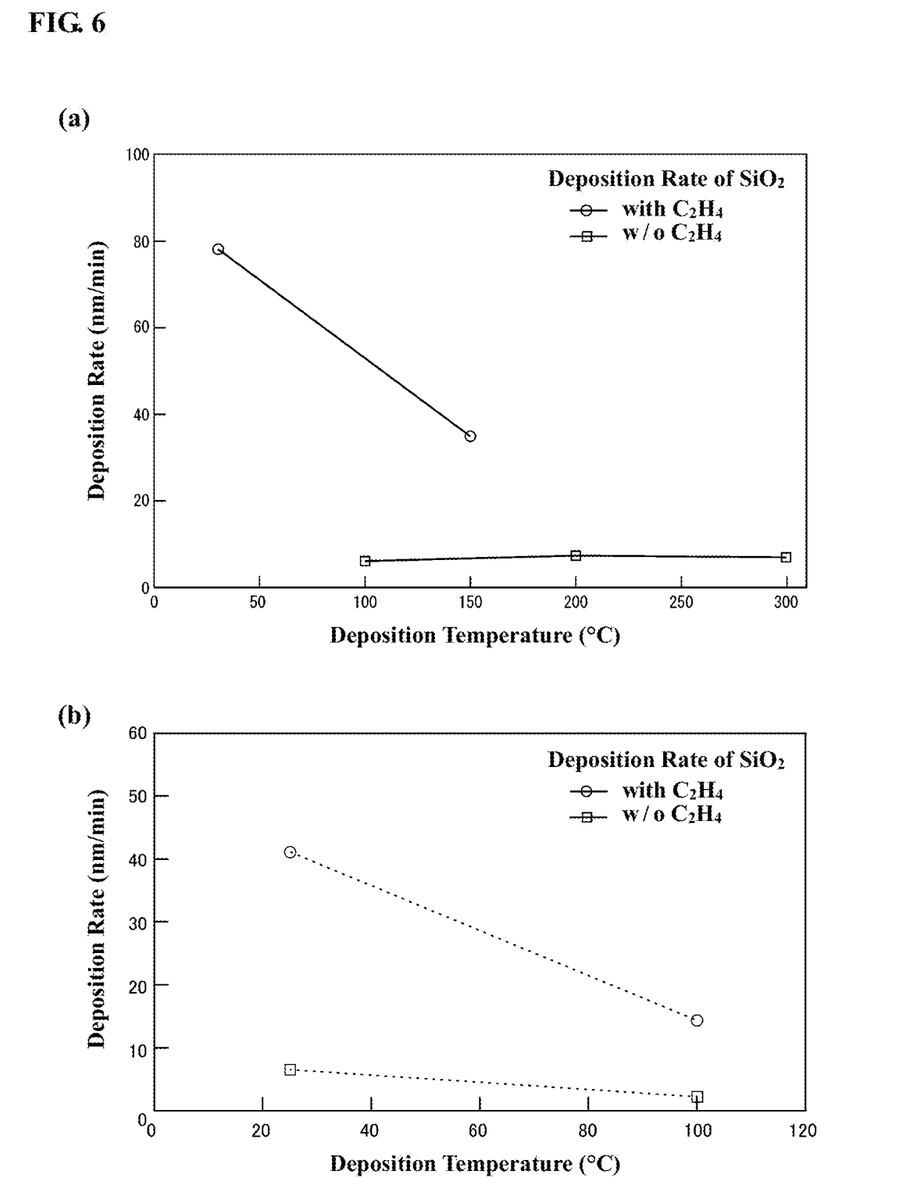

FIGS. 6(a) and (b) are diagrams respectively showing a relationship between the deposition rate and deposition temperature of the $SiO_2$ film under the conditions of the oxide film formation treatment explained by reference to FIGS. 4 and 5. As shown in FIG. 6, the deposition rate was considerably higher in the oxide film formation treatment using the ozone gas and the ethylene gas (as indicated by circle plots) than in the oxide film formation treatment using no ethylene gas (that is, using only the ozone gas as the reactive gas; as indicated by square plots). Further, there was seen a correlation between the deposition rate (nm/min) and deposition temperature of the oxide film. The deposition rate of the oxide film was maximum at room temperature (25° C.). The reason for this is assumed that thermal convection due to heating of the workpiece 7 could contribute to inhibition of the reaction. The temperature of the workpiece 7 is thus preferably, for example, 200° C. or lower, more preferably 150° C. or lower, still more preferably 100° C. or lower, yet more preferably 80° C. or lower, yet still more preferably 25° C. or lower, for the high-rate deposition of the oxide film. Moreover, damage to the workpiece 7 and to the oxide film formed on the workpiece 7 is suppressed by lowering the heating temperature of the workpiece 7. It is hence preferable that the temperature of the workpiece 7 during the formation of the oxide film is as low as possible. By setting the temperature of the workpiece 7 to 10° C. or higher, for example, it is possible to form the oxide film at a sufficient deposition rate while preventing damage to the workpiece 7 and to the oxide film formed on the workpiece 7.

Figure 7:
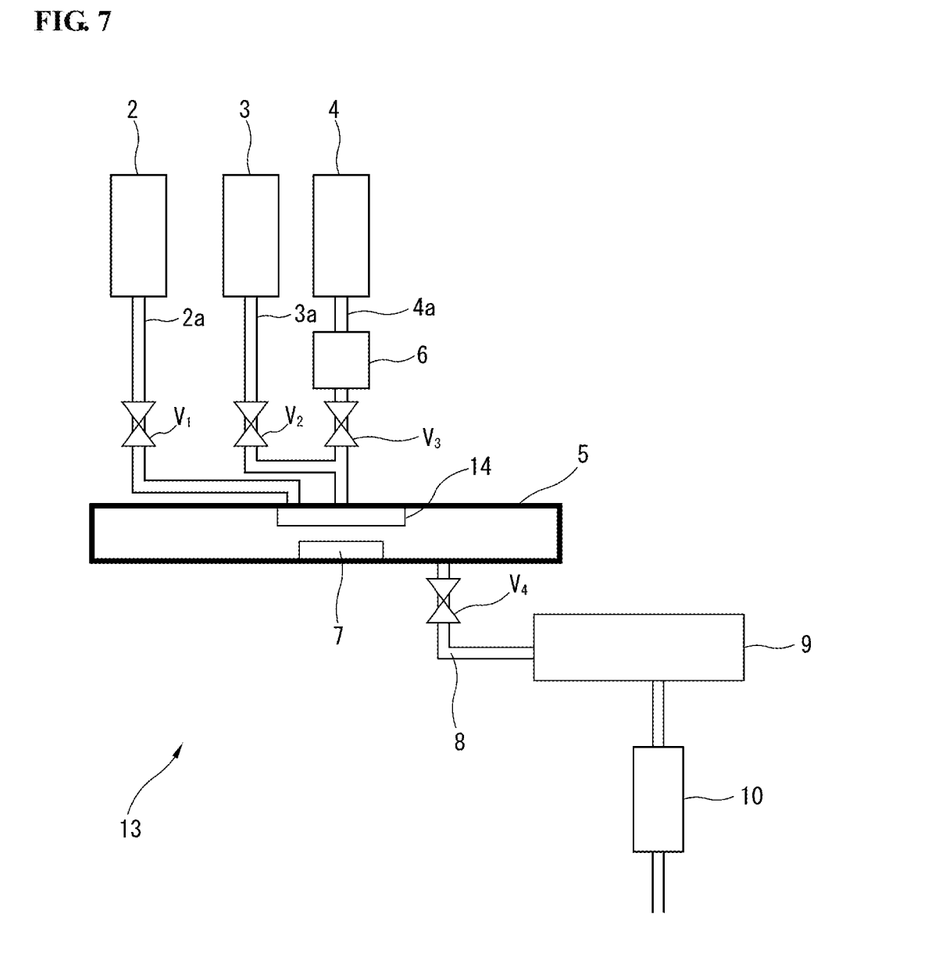
FIG. 7 is a schematic view of an oxide film formation treatment system according to a second embodiment of the present invention.

FIG. 7 is a schematic view of an oxide film formation treatment system 13 according to the second embodiment of the present invention. The oxide film formation system 13 according to the second embodiment of the present invention is different from the oxide film formation system 1 according to the first embodiment of the present invention in that a shower head 14 is provided in the treatment furnace 5. Thus, the same configurations as those of the oxide film formation system 1 according to the first embodiment of the present invention are denoted by the same reference numerals, and detailed description thereof will be omitted herefrom.

The shower head 14 is disposed at a position away from the workpiece 7 such that a face of the shower head in which supply holes for gas ejection are formed is opposed to the treatment surface of the workpiece 7. To the shower head 14, the ozone gas generator 2, the ethylene gas cylinder 3 and the TEOS gas cylinder 4 are connected via the pipes 2a, 3a and 4a. By supplying the respective gases from the shower head 14, the oxide film is formed more uniformly on the workpiece 7.

Although it is preferable to supply the ozone gas, the unsaturated hydrocarbon gas and the raw material gas separately from the shower head 14, it is structurally difficult to form the shower head 14 with supply holes for separate supply of three or more kinds of gases. For this reason, a double shower head as disclosed in Japanese Laid-Open Patent Publication No. 2009-141028 is suitably used as the shower head 14. The double shower head is a shower head having supply holes for respectively ejecting two different kinds of gases.

In the case of using a double shower head as the shower head 14, two of three kinds of gases are mixed in advance of being supplied to the workpiece 7. For example, the shower head 14 may be provided with a mixing space for mixing the unsaturated hydrocarbon gas and the raw material gas so as to supply the ozone gas and the mixed gas of the unsaturated hydrocarbon gas and the raw material gas from different supply holes of the shower head 14 to the workpiece 7. Alternatively, the shower head 14 may be provided with a mixing space for mixing the ozone gas and the raw material gas so as to supply the unsaturated hydrocarbon gas and the mixed gas of the ozone gas and the raw material gas from different supply holes of the shower head 14 to the workpiece 7. By supplying the ozone gas and the unsaturated hydrocarbon gas (or raw material gas) to the workpiece 7 separately without being previously mixed, the radical species of short lifetime is efficiently generated at the surface of the workpiece 7. It is consequently possible to obtain an improvement in the deposition rate of the oxide film and an improvement in the in-plane uniformity of the oxide film.

The oxide film formation system 13 according to the second embodiment allows the formation of the oxide film at high deposition rate by the adoption of the same process treatment conditions and treatment procedures as those of the oxide film formation system 1 according to the first embodiment.

As described above, the oxide film formation method according to the first or second embodiment of the present invention allows the formation of the oxide film on the workpiece 7 under low-temperature conditions of 200° C. or lower. Therefore, the oxide film is formed on the workpiece 7 (such as substrate or film) even when the workpiece 7 is made of a material having a low heat-resistant temperature (e.g. organic material such as synthetic resin).

In the oxide film formation method according to the embodiment of the present invention, the workpiece 7 is prevented from damage because the oxide film is formed on the workpiece 7 without using a plasma. It is thus possible to, particularly in the case where a thin film (e.g. an undercoat film (typically, organic thin film) constituting an electronic device) has been formed before the formation of an oxide film (e.g. $SiO_2$ film) on the electronic device or organic film, form the oxide film on the electronic device or organic film without causing damage such as breakdown to the thin film.

By the oxide film formation method according to the embodiment of the present invention, the oxide film is formed at a high deposition rate under treatment conditions of 200° C. or lower. In view of the fact that the oxide films formed in the above-mentioned embodiment examples had a pressure resistance of 5 MV/cm, it can be said that the oxide film is formed with a good pressure resistance and good gas barrier properties by the oxide film formation method according to the embodiment of the present invention.

Conventionally, the temperature for effecting film deposition on materials where gas barrier properties are required is 80° C. or lower. The oxide film formation method according to the embodiment of the present invention is thus suitably applicable for the deposition of oxide films on materials where gas barrier properties are required.

The oxide film formation method according to the embodiment of the present invention is accordingly applicable to various techniques such as not only high functionalization of organic films but also high functionalization and multi-lamination of film layer structures (bulk control). The highly functionalized organic films are usable in the fields of smartphones, tablet devices, liquid crystal displays, solar panels, automotive products and the like. By forming electronic devices, wirings etc. on these organic films, there are obtained flexible devices capable of functioning even on products susceptible to deformations. The thus-obtained flexible devices are usable for wearable computers, digital signages applicable or mountable onto variable locations, and the like.

Although the oxide film formation method according to the present invention has been described above by way of the specific embodiments, the oxide film formation method according to the present invention is not limited to these specific embodiments. Various modifications and variations of the embodiments are possible within the range that does not impair the features of the present invention. All such modifications and variations fall within the technical scope of the present invention.

The invention claimed is:

1. An oxide film formation method comprising supplying, to a workpiece on which an oxide film is to be formed, an ozone gas, an unsaturated hydrocarbon gas and a raw material gas containing a Si element or metal element which is a constituent element of the oxide film, whereby the oxide film is formed on a surface of the workpiece by a chemical vapor deposition process, wherein a supply flow rate of the ozone gas and a supply flow rate of the unsaturated hydrocarbon gas are maintained constant, and a supply flow rate of the raw material gas is changed with time or periodically.

2. The oxide film formation method according to claim 1, wherein the workpiece is a substrate or film made of a synthesis resin, and wherein, after the ozone gas and the unsaturated hydrocarbon gas are supplied to the workpiece, the oxide film is formed on the surface of the workpiece by supplying the ozone gas, the unsaturated hydrocarbon gas and the raw material gas to the workpiece.

3. The oxide film formation method according to claim 1, wherein, after the oxide film is formed on the surface of the workpiece by supplying the ozone gas, the unsaturated hydrocarbon gas and the raw material gas to the workpiece, the ozone gas and the unsaturated hydrocarbon gas are supplied to the workpiece.

4. The oxide film formation method according to claim 1, wherein the unsaturated hydrocarbon gas is an ethylene gas.

5. The oxide film formation method according to claim 1, wherein, during the formation of the oxide film on the workpiece, the supply flow rate of the ozone gas is equal to or more than twice the total supply flow rate of the unsaturated hydrocarbon gas and the raw material gas.

6. The oxide film formation method according to claim 1, wherein, during the formation of the oxide film on the workpiece, the supply flow rate of the ozone gas is 0.2 sccm or higher.

7. An oxide film formation method comprising supplying, to a workpiece on which an oxide film is to be formed, an ozone gas, an unsaturated hydrocarbon gas and a raw material gas containing a Si element or metal element which is a constituent element of the oxide film, whereby the oxide film is formed on a surface of the workpiece by a chemical vapor deposition process, wherein a supply flow rate of the ozone gas and a supply flow rate of the raw material gas are maintained constant, and a supply flow rate of the unsaturated hydrocarbon gas is changed with time or periodically.

8. The oxide film formation method according to claim 7, wherein the workpiece is a substrate or film made of a synthesis resin, and wherein, after the ozone gas and the unsaturated hydrocarbon gas are supplied to the workpiece, the oxide film is formed on the surface of the workpiece by supplying the ozone gas, the unsaturated hydrocarbon gas and the raw material gas to the workpiece.

9. The oxide film formation method according to claim 7, wherein, after the oxide film is formed on the surface of the workpiece by supplying the ozone gas, the unsaturated hydrocarbon gas and the raw material gas to the workpiece, the ozone gas and the unsaturated hydrocarbon gas are supplied to the workpiece.

10. The oxide film formation method according to claim 7, wherein the unsaturated hydrocarbon gas is an ethylene gas.

11. The oxide film formation method according to claim 7, wherein, during the formation of the oxide film on the workpiece, the supply flow rate of the ozone gas is equal to or more than twice the total supply flow rate of the unsaturated hydrocarbon gas and the raw material gas.

12. The oxide film formation method according to claim 7, wherein, during the formation of the oxide film on the workpiece, the supply flow rate of the ozone gas is 0.2 sccm or higher.

13. An oxide film formation method comprising supplying, to a workpiece on which an oxide film is to be formed, an ozone gas, an unsaturated hydrocarbon gas and a raw material gas containing a Si element or metal element which is a constituent element of the oxide film, whereby the oxide film is formed on a surface of the workpiece by a chemical vapor deposition process, wherein a supply flow rate of the unsaturated hydrocarbon gas and a supply flow rate of the raw material gas are maintained constant, and a supply flow rate of the ozone gas is changed with time or periodically.

14. The oxide film formation method according to claim 13, wherein the workpiece is a substrate or film made of a synthesis resin, and wherein, after the ozone gas and the unsaturated hydrocarbon gas are supplied to the workpiece, the oxide film is formed on the surface of the workpiece by supplying the ozone gas, the unsaturated hydrocarbon gas and the raw material gas to the workpiece.

15. The oxide film formation method according to claim 13, wherein, after the oxide film is formed on the surface of the workpiece by supplying the ozone gas, the unsaturated hydrocarbon gas and the raw material gas to the workpiece, the ozone gas and the unsaturated hydrocarbon gas are supplied to the workpiece.

16. The oxide film formation method according to claim 13, wherein the unsaturated hydrocarbon gas is an ethylene gas.

17. The oxide film formation method according to claim 13, wherein, during the formation of the oxide film on the workpiece, the supply flow rate of the ozone gas is equal to or more than twice the total supply flow rate of the unsaturated hydrocarbon gas and the raw material gas.

18. The oxide film formation method according to claim 13,
wherein, during the formation of the oxide film on the workpiece, the supply flow rate of the ozone gas is 0.2 sccm or higher.

19. An oxide film formation method comprising supplying, from a shower head to a workpiece on which an oxide film is to be formed, an ozone gas, an unsaturated hydrocarbon gas and a raw material gas containing a Si element or metal element which is a constituent element of the oxide film, whereby the oxide film is formed on a surface of the workpiece by a chemical vapor deposition process,
wherein the supplying includes mixing the unsaturated hydrocarbon gas and the raw material gas to prepare a mixed gas in advance, and then, supplying the mixed gas and the ozone gas to the workpiece from different supply holes of the shower head.

20. The oxide film formation method according to claim 19,
wherein, during the formation of the oxide film on the workpiece, the supply flow rate of the ozone gas is 0.2 sccm or higher.

21. An oxide film formation method comprising supplying, from a shower head to a workpiece on which an oxide film is to be formed, an ozone gas, an unsaturated hydrocarbon gas and a raw material gas containing a Si element or metal element which is a constituent element of the oxide film, whereby the oxide film is formed on a surface of the workpiece by a chemical vapor deposition process,
wherein the supplying includes mixing the ozone gas and the raw material gas to prepare a mixed gas in advance, and then, supplying the mixed gas and the unsaturated hydrocarbon gas to the workpiece from different supply holes of the shower head.

22. The oxide film formation method according to claim 21,
wherein, during the formation of the oxide film on the workpiece, the supply flow rate of the ozone gas is 0.2 sccm or higher.

* * * * *